(12) United States Patent
Lin et al.

(10) Patent No.: US 8,497,560 B2
(45) Date of Patent: Jul. 30, 2013

(54) LED PACKAGE AND METHOD OF ASSEMBLING THE SAME

(75) Inventors: Ming-Te Lin, Taipei County (TW); Ming-Yao Lin, Taipei County (TW); Kuang-Yu Tai, Hsinchy (TW)

(73) Assignee: Industrial Technology Research Institute, Hsinchu (TW)

( * ) Notice: Subject to any disclaimer, the term of this patent is extended or adjusted under 35 U.S.C. 154(b) by 231 days.

(21) Appl. No.: 12/714,371

(22) Filed: Feb. 26, 2010

(65) Prior Publication Data
US 2010/0148206 A1 Jun. 17, 2010

Related U.S. Application Data

(63) Continuation-in-part of application No. 11/544,046, filed on Oct. 6, 2006, now abandoned, and a continuation-in-part of application No. 11/936,090, filed on Nov. 7, 2007, now Pat. No. 7,816,698.

(51) Int. Cl.
*H01L 31/0203* (2006.01)

(52) U.S. Cl.
USPC ........... 257/433; 257/675; 257/676; 257/680; 257/687; 257/787

(58) Field of Classification Search
USPC ................. 257/433, 675, 676, 680, 685, 687, 257/787
See application file for complete search history.

(56) References Cited

U.S. PATENT DOCUMENTS

| | | | |
|---|---|---|---|
| 177,636 A | 5/1876 | Hartinger | |
| 6,335,548 B1 | 1/2002 | Roberts et al. | |
| 6,429,464 B1 | 8/2002 | Lin | |
| 6,517,218 B2 * | 2/2003 | Hochstein | 362/294 |
| 6,531,328 B1 * | 3/2003 | Chen | 438/26 |
| 6,943,433 B2 * | 9/2005 | Kamada | 257/666 |
| 7,045,905 B2 | 5/2006 | Nakashima | |
| 7,161,189 B2 | 1/2007 | Wu | |
| 7,183,587 B2 * | 2/2007 | Negley et al. | 257/99 |
| 7,201,495 B2 | 4/2007 | Epstein | |
| 7,321,161 B2 | 1/2008 | Teixeira et al. | |
| 7,495,322 B2 * | 2/2009 | Hashimoto et al. | 257/676 |
| 7,777,235 B2 * | 8/2010 | Mazzochette et al. | 257/81 |
| 7,816,689 B2 | 10/2010 | Wu | |
| 7,906,793 B2 * | 3/2011 | Negley | 257/98 |
| 2001/0052600 A1 * | 12/2001 | Sakamoto et al. | 257/79 |
| 2003/0189830 A1 * | 10/2003 | Sugimoto et al. | 362/294 |
| 2004/0075100 A1 | 4/2004 | Bogner et al. | |
| 2007/0057364 A1 * | 3/2007 | Wang et al. | 257/701 |
| 2007/0080354 A1 | 4/2007 | Lin et al. | |

FOREIGN PATENT DOCUMENTS

| | | |
|---|---|---|
| TW | M258416 | 3/2005 |
| TW | I307179 B | 1/2008 |
| WO | WO 2008/043264 A1 | 4/2008 |

* cited by examiner

*Primary Examiner* — Ori Nadav

(57) ABSTRACT

An LED package is provided. The LED package includes a carrier, an LED chip, a conductive structure, a first encapsulant, a lens and a heat sink. The carrier is cup shaped and comprises a bottom portion and a lateral wall. The LED chip is received in the carrier and disposed on the bottom portion. The conductive structure is electrically connected to the LED chip. The first encapsulant is received in the carrier and fixing the carrier and the conductive structure. The lens is corresponding to the LED chip. The carrier is embedded in the heat sink, and heat generated by the LED chip is transmitted to the heat sink via the bottom portion and the lateral wall of the carrier.

21 Claims, 25 Drawing Sheets

110'

LED PACKAGE AND METHOD OF ASSEMBLING THE SAME

CROSS REFERENCE TO RELATED APPLICATIONS

This application is a Continuation-In-Part of pending U.S. patent application Ser. No. 11/544,046, filed Oct. 6, 2006 and entitled "Power Package and Fabrication Method Thereof."

This application is a Continuation-In-Part of pending U.S. patent application Ser. No. 11/936,090, filed Nov. 7, 2007 and entitled "Heat Dissipation Package for Heat Generation Element."

TECHNICAL FIELD

The present disclosure relates to an LED (Light Emitting Diode) package, and in particular relates to an LED package with a carrier formed by punching.

BACKGROUND

LED industry has been developed for over 30 years, the operating power of LED is kept increasing, traditional package types of bulb-shaped LED, SMD LED have no longer met the requirement of heat dissipating. Various kinds of high power LED package structures are introduced, such as the typical Luxeon from Lumileds, Jupiter from Nichia, and Golden Dragon from Osram. Other LED package companies, such as Cree and Toyota, also presented high power LED package structures for encapsulating and fabricating LED related products. A portion of the above high power LED package structures adopted a design of thin metal member encapsulated with plastic plus a heat dissipating base, such as the Luxeon from Lumileds; while another portion adopted a design of thick and thin metal member encapsulated with plastic for achieving high heat dissipating efficiency, such as the Jupiter from Nichia. The fabricating process of the LED package structures adopted the design of thin metal member encapsulated with plastic plus a heat dissipating base, compared with that of the conventional bulb-shaped LED, is more complicated, the fabricating cost thereof is high. Whereas the design of thick and thin metal member encapsulated with plastic has advantage in heat dissipating, however wherein the thick and thin metal member is such a kind of metal material having a portion of its thick area processed into thin area, the design flexibility and size ratio of which will be restricted in subsequent process of patterns and outlines.

Consequently, how to solve the problem of restriction to the design flexibility and size ratio, and high cost caused by complicated process in the course of processing conventional thick and thin metal member and subsequently outlines, has become a task needs to be faced in related fields.

BRIEF SUMMARY

A detailed description is given in the following embodiments with reference to the accompanying drawings.

An LED package is provided. The LED package includes a carrier, an LED chip, a conductive structure, a first encapsulant, a lens and a heat sink. The carrier is cup shaped and comprises a bottom portion and a lateral wall. The LED chip is received in the carrier and disposed on the bottom portion. The conductive structure is electrically connected to the LED chip. The first encapsulant is received in the carrier and fixing the carrier and the conductive structure. The lens is corresponding to the LED chip. The carrier is embedded in the heat sink, and heat generated by the LED chip is transmitted to the heat sink via the bottom portion and the lateral wall of the carrier.

In the embodiment, the carrier is embedded in the heat sink. Thus, compared with the conventional art, a contact surface between the carrier and the heat sink is increased, and heat dissipation efficiency of the LED package of the embodiment of the disclosure is therefore increased. Additionally, the free ends of the leads are suspended in midair. When the leads are soldered with other conductors, there is no requirement to heat the heat sink.

In the method of assembling the LED package of the disclosure, a plurality of particular elements (for example, carrier or conductive structure) of the LED package can be formed on a single substrate. By assembling the substrates carrying different elements of the LED package, the LED package of the embodiment can be mass produced.

BRIEF DESCRIPTION OF THE DRAWINGS

The present disclosure can be more fully understood by reading the subsequent detailed description and examples with references made to the accompanying drawings, wherein.

DETAILED DESCRIPTION

Figure 1:
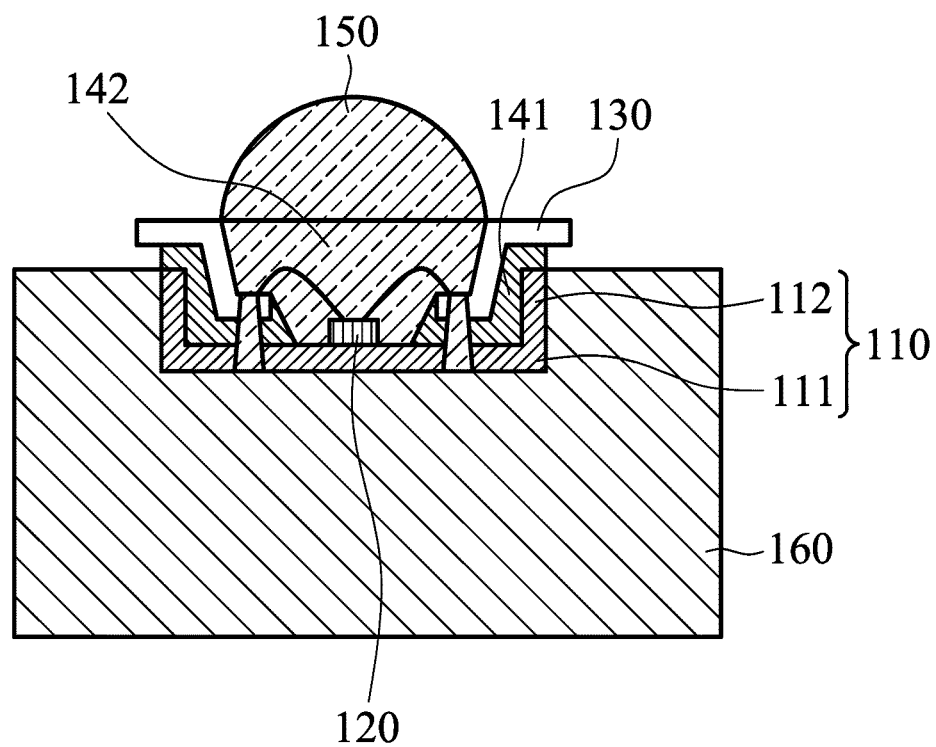
FIG. 1 shows a sectional view of an LED package of a first embodiment.

FIG. 1 shows a sectional view of an LED package of a first embodiment, which includes a carrier 110, an LED chip 120, a conductive structure 130, a first encapsulant 141, a second encapsulant 142, a lens 150 and a heat sink 160. The carrier 110 has a bottom portion 111 and a lateral wall 112. The LED chip 120 is received in the carrier 110 and disposed on a bottom portion 111. The conductive structure 130 is electrically connected to the LED chip 120. The first encapsulant 141 is received in the carrier 110, and fixes the carrier 110 to the conductive structure 130. The second encapsulant 142 connects the lens 150 to the first encapsulant 141. The lens 150 corresponds to the LED chip 120.

The carrier 110 is cup shaped, and made of metal. The carrier 110 is embedded in the heat sink 160. Heat generated by the LED chip 120 is transmitted to the heat sink 160 via the bottom portion 111 and the lateral wall 112 of the carrier 110.

The conductive structure 130 comprises leads (130). Each lead has a free end, and the free end is suspended in midair. In another embodiment, the free end of the lead is attached on a lateral surface of the first encapsulant 141.

In the embodiment, the carrier is embedded in the heat sink. Thus, compared with conventional art, a contact surface between the carrier and the heat sink is increased, and heat dissipation efficiency of the LED package of the embodiment is therefore increased. Additionally, the free ends of the leads are suspended in midair. When the leads are soldered with other conductors, there is no requirement to heat the heat sink.

Figure 2A:
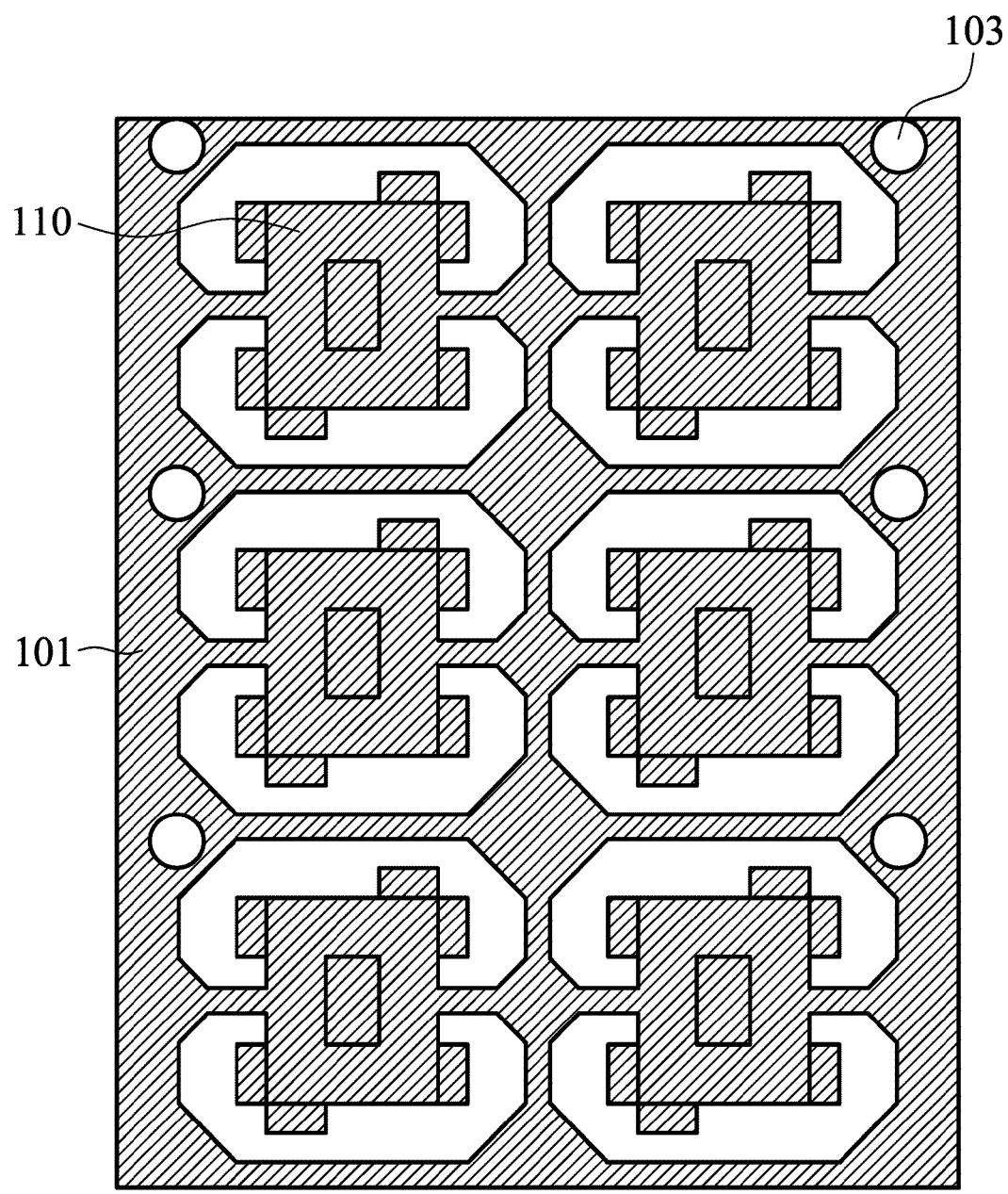
FIGS. 2A-2G show the steps of a method for assembling the LED package of the first embodiment.
Figure 2B:
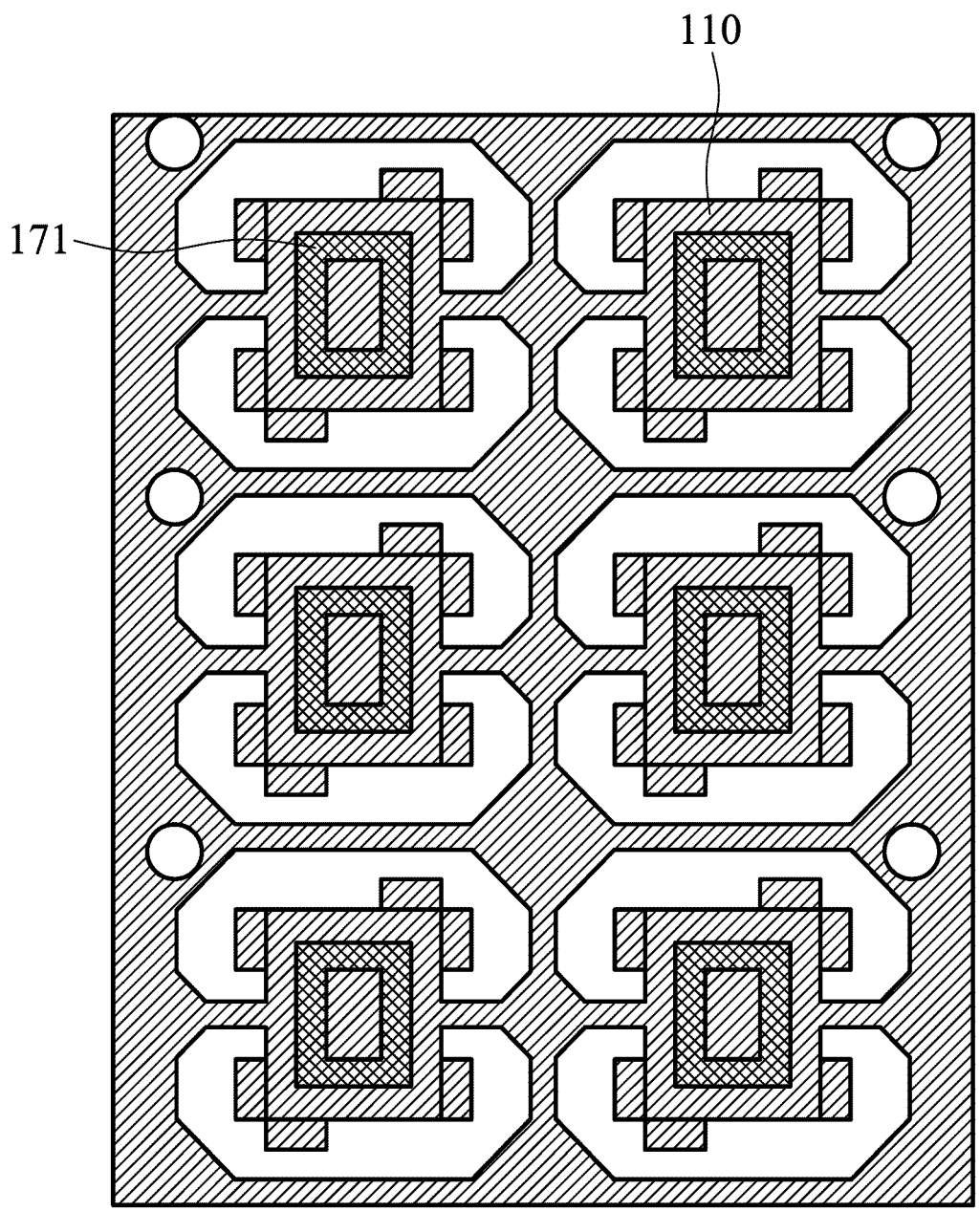
Figure 2C:
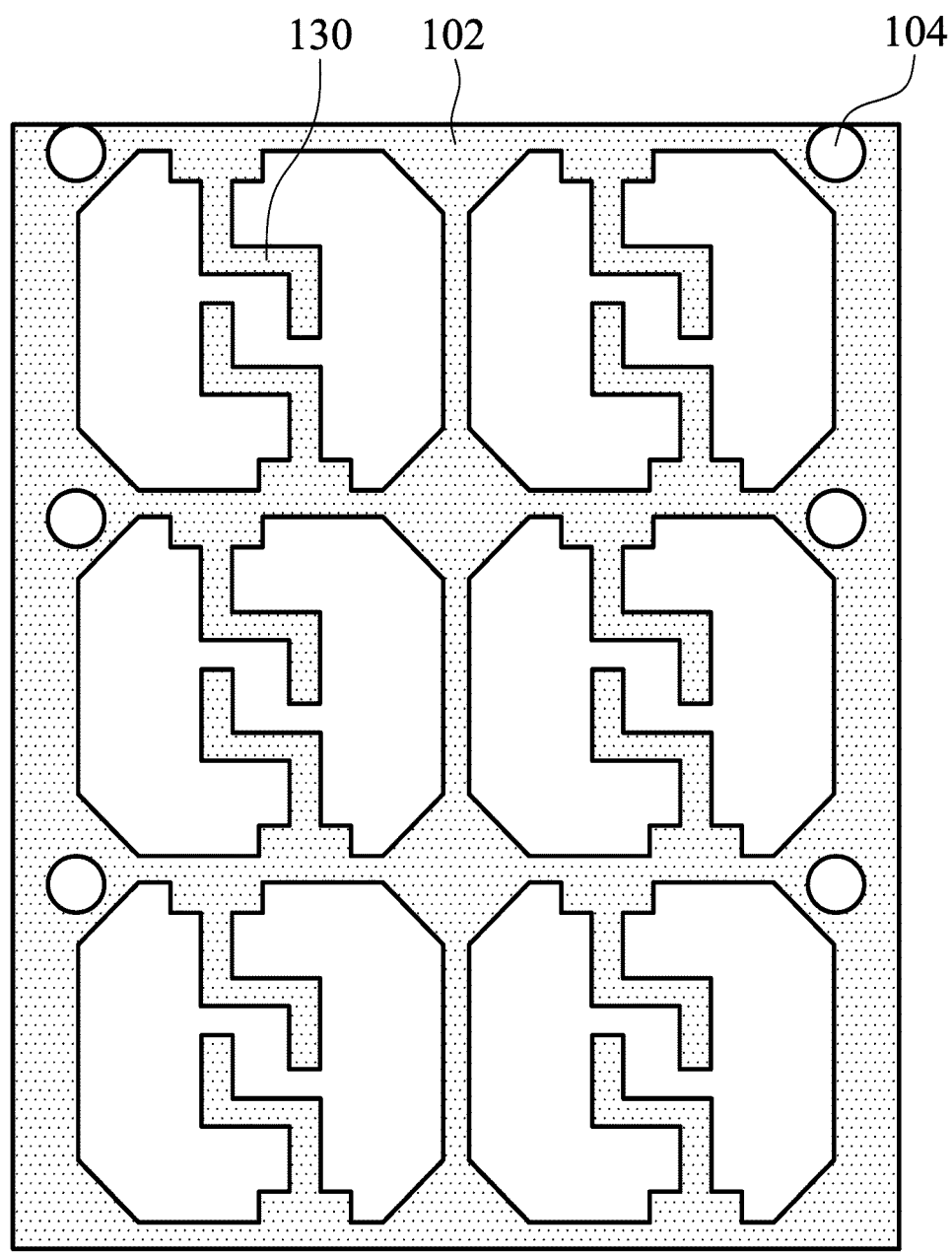
Figure 2D:
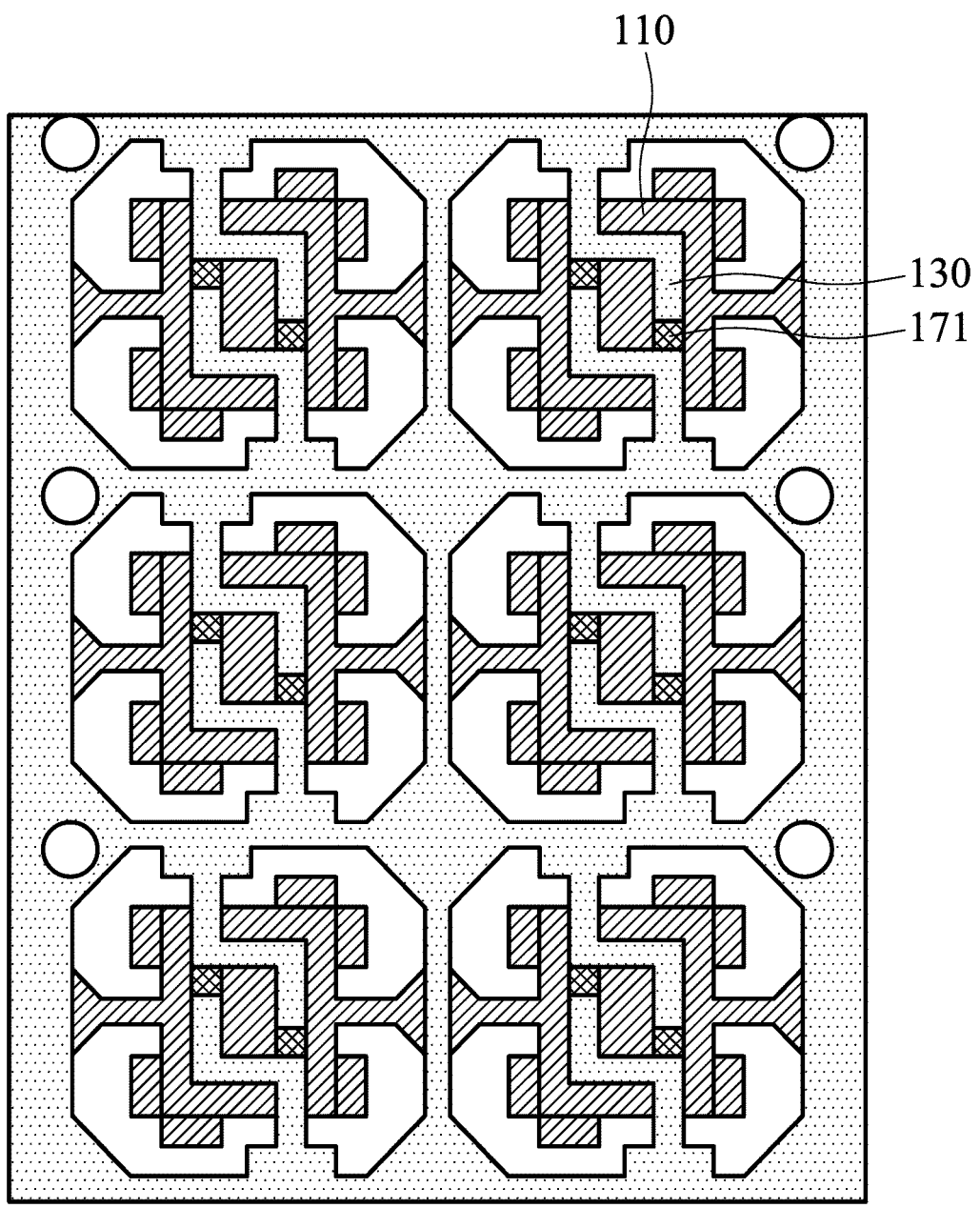
Figure 2E:
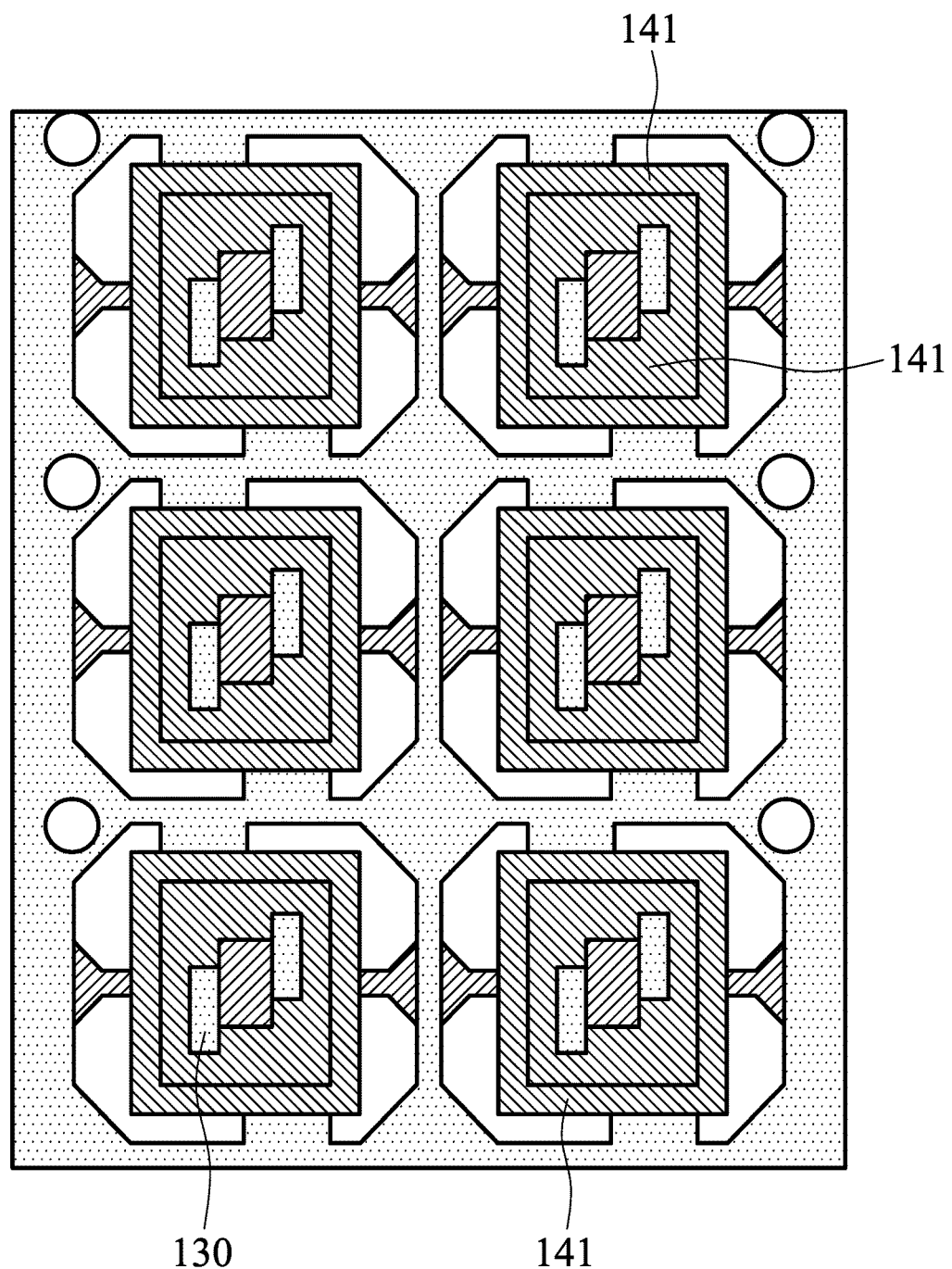
Figure 2F:
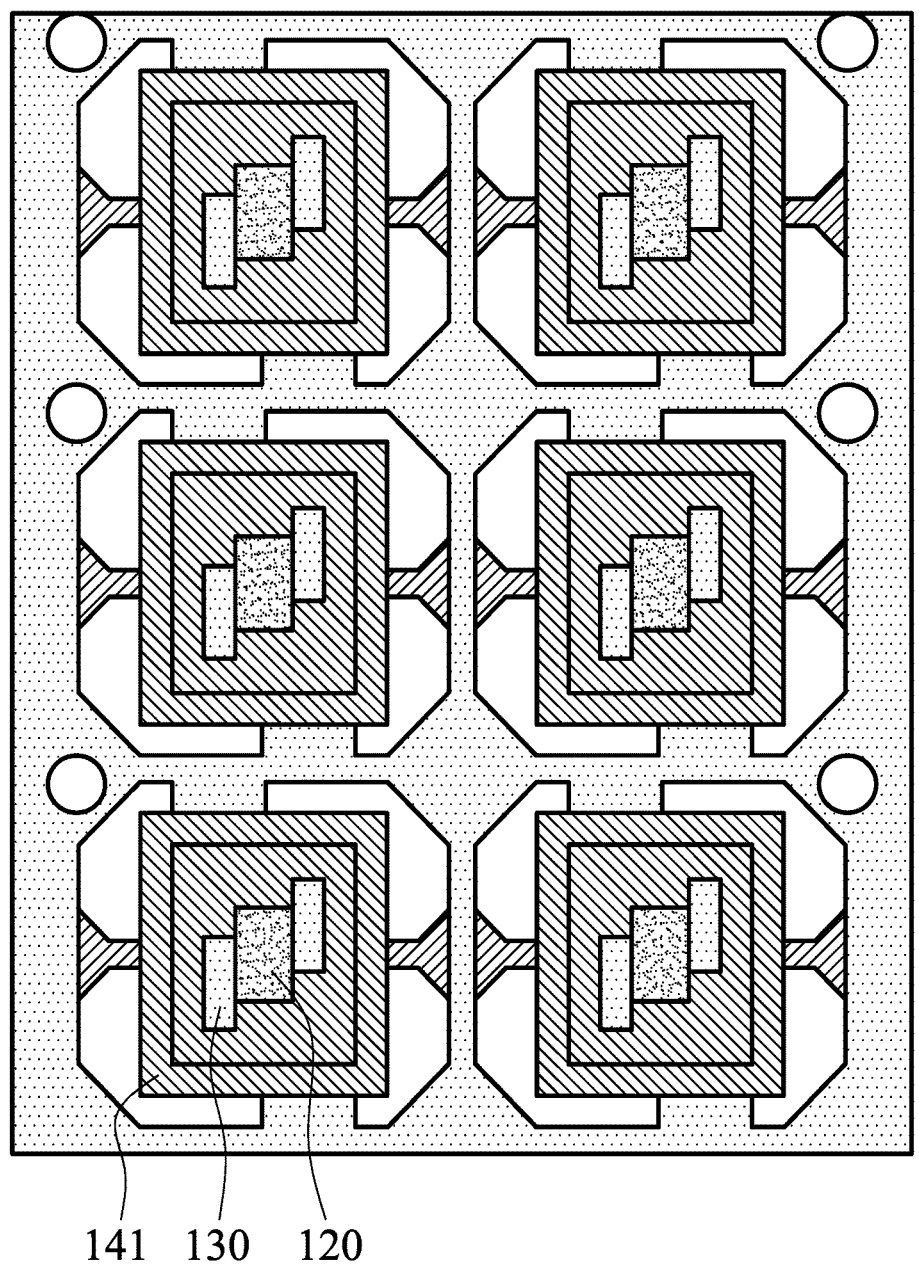
Figure 2G:
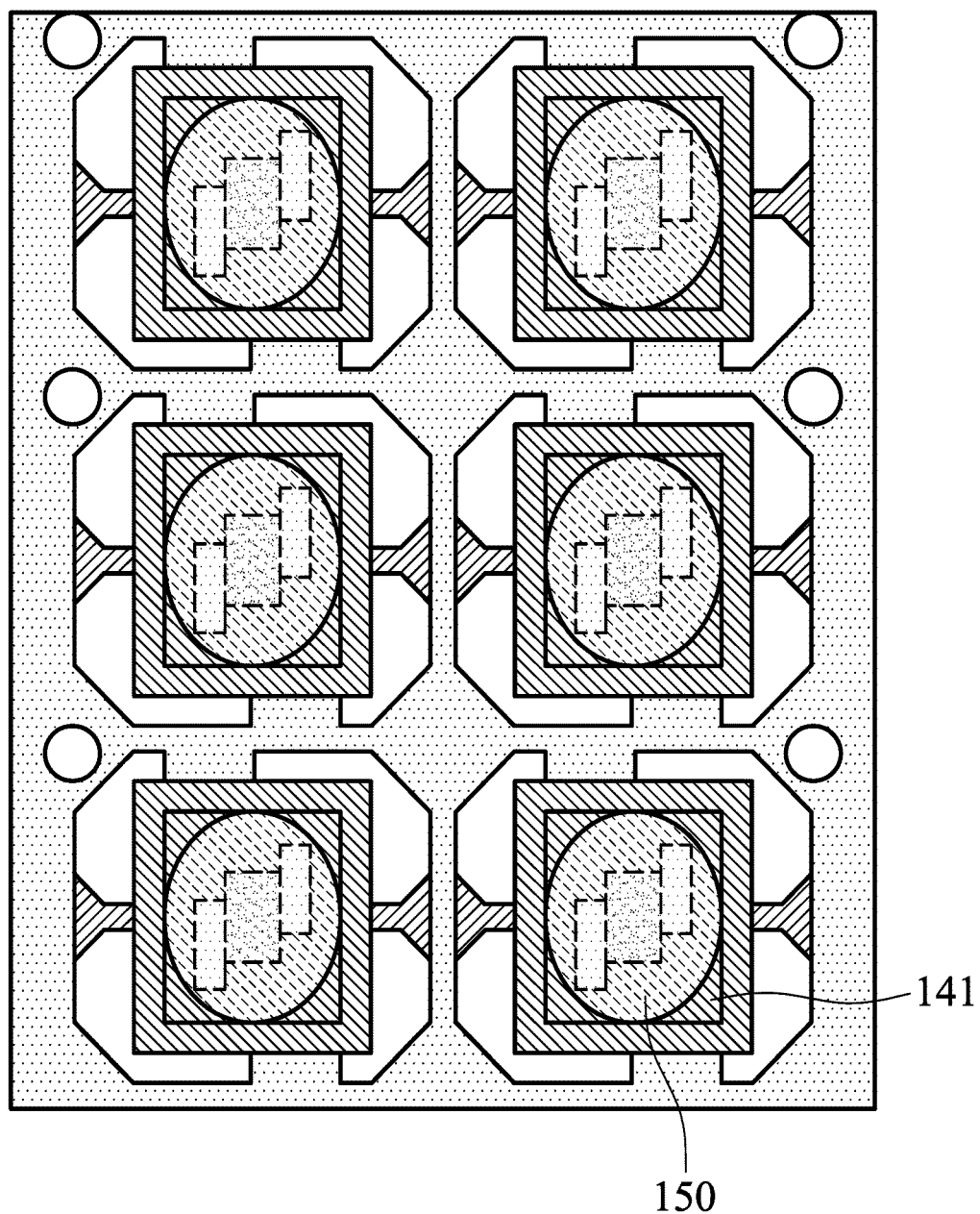

FIGS. 2A-2G show the steps of a method for assembling the LED package of the embodiment. In the embodiments, a plurality of particular element (for example, carrier or conductive structure) of the LED package can be formed on a single substrate. By assembling the substrates carrying different elements of the LED package, the LED package of the embodiment can be mass produced. With reference to FIG. 2A, first, the carriers 110 are formed from a first substrate 101 by punching. The first substrate 101 is made of metal. Then, with reference to FIG. 2B, an isolation layer 171 is formed on the carrier 110 by injection molding. Next, with reference to FIG. 2C, the conductive structures 130 are formed from a second substrate 102. Then, with reference to FIG. 2D, the second substrate 102 overlaps the first substrate 101 to assemble the carriers 110 and the conductive structures 130, wherein the isolation layer 171 separates the carriers 110 from the conductive structures 130. Next, with reference to FIG. 2E, the first encapsulant 141 is injected into the carriers 110, wherein the first encapsulant 141 fixes the carriers 110 and the conductive structures 130, and the first encapsulant 141 is entirely received in the carriers 110. Then, with reference to FIG. 2F, the LED chips 120 are disposed on the carrier 110, wherein the LED chips 120 are electrically connected to the conductive structures 130. Then, with reference to FIG. 2G, the second encapsulant 142 is injected to connect the lenses 150 to the first encapsulant 141. Finally, the LED packages are cut from the first and second substrates.

With reference to FIG. 2A, a plurality of alignment holes 103 are formed on the first substrate 101, and a plurality of alignment holes 104 are formed on the second substrate 102. The alignment holes 103 and 104 prevent the carriers from moving relative to the conductive structure during assembling.

Figure 3A:
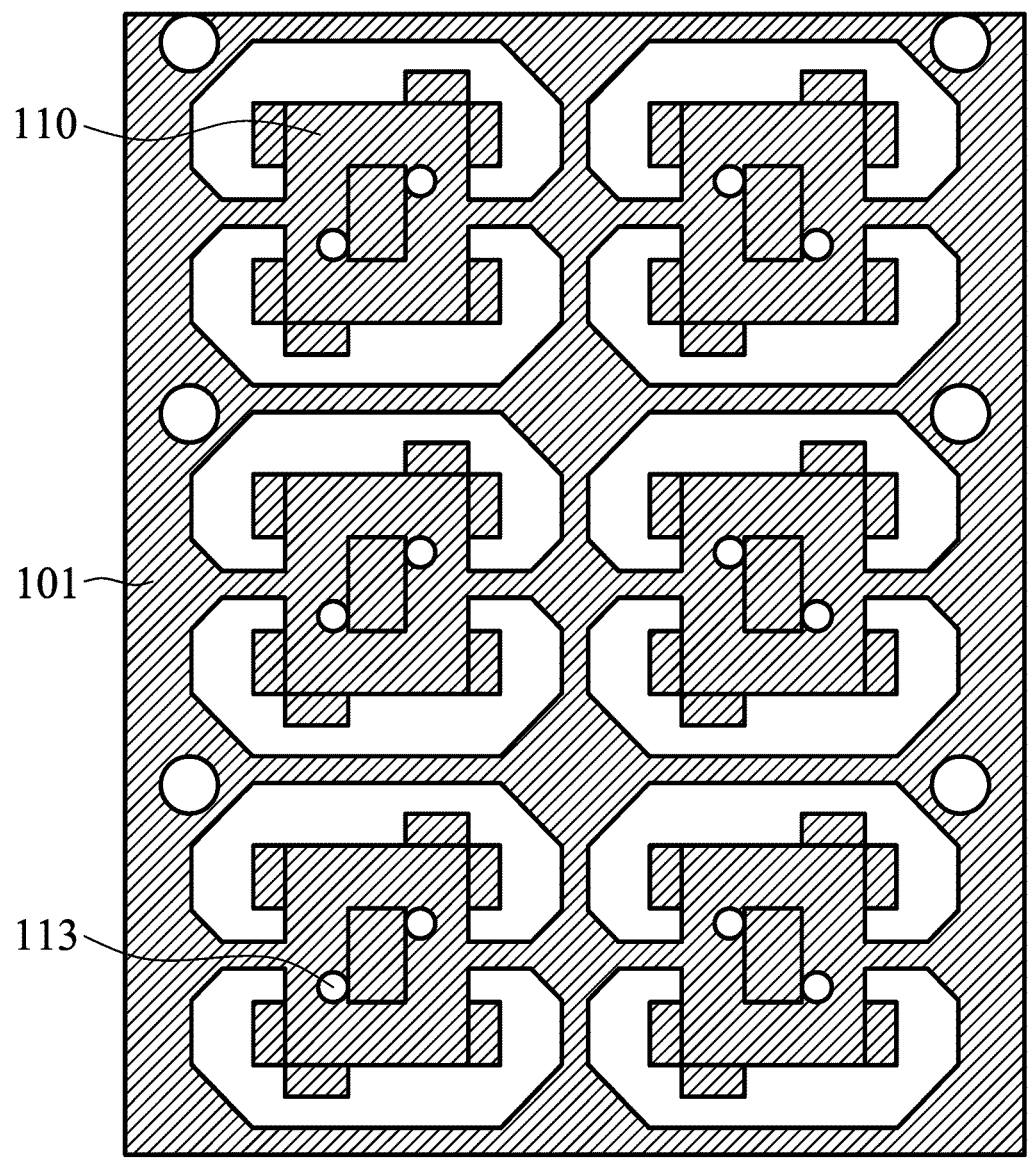
FIGS. 3A-3F show the steps of another method for assembling the LED package of the embodiment.
Figure 3B:
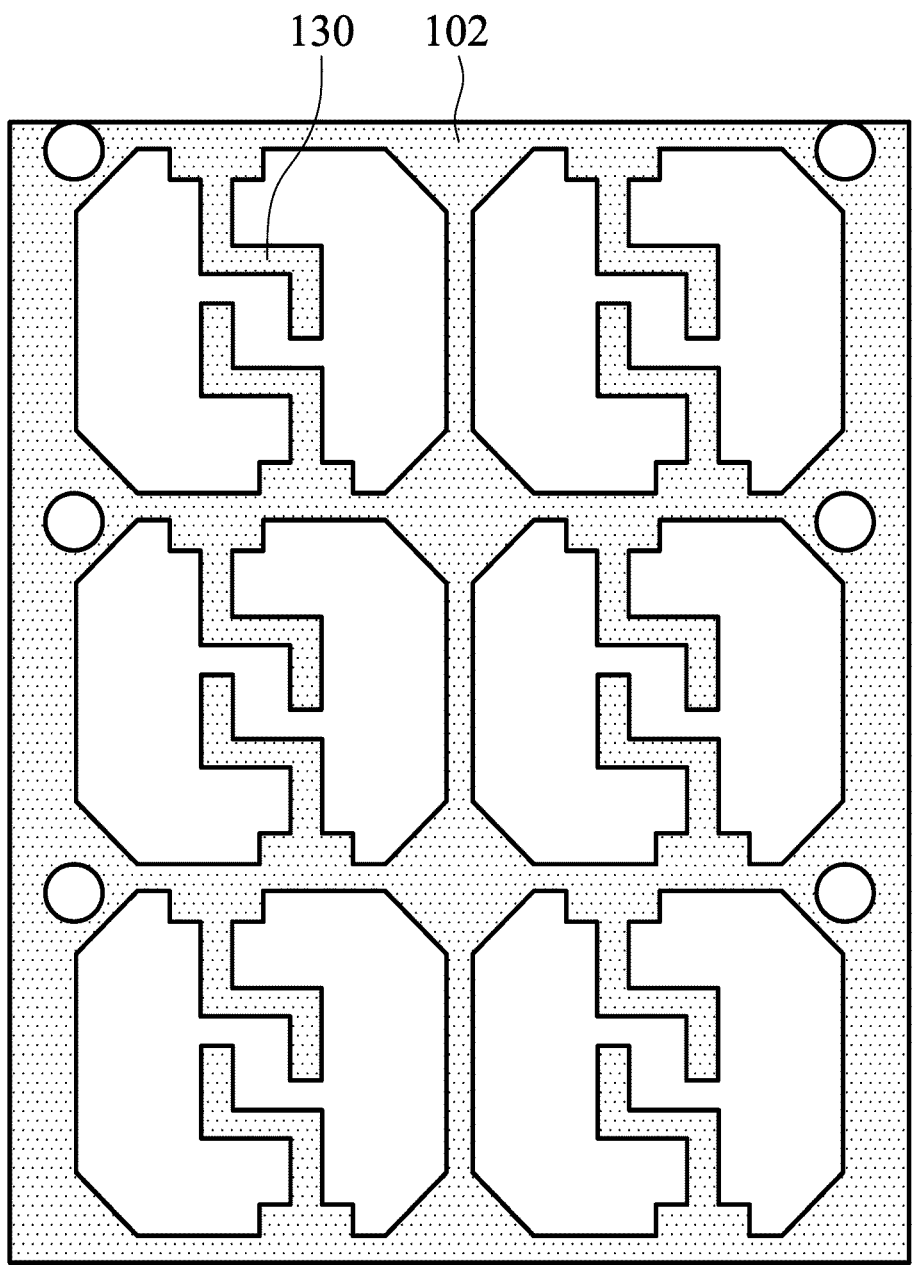
Figure 3C:
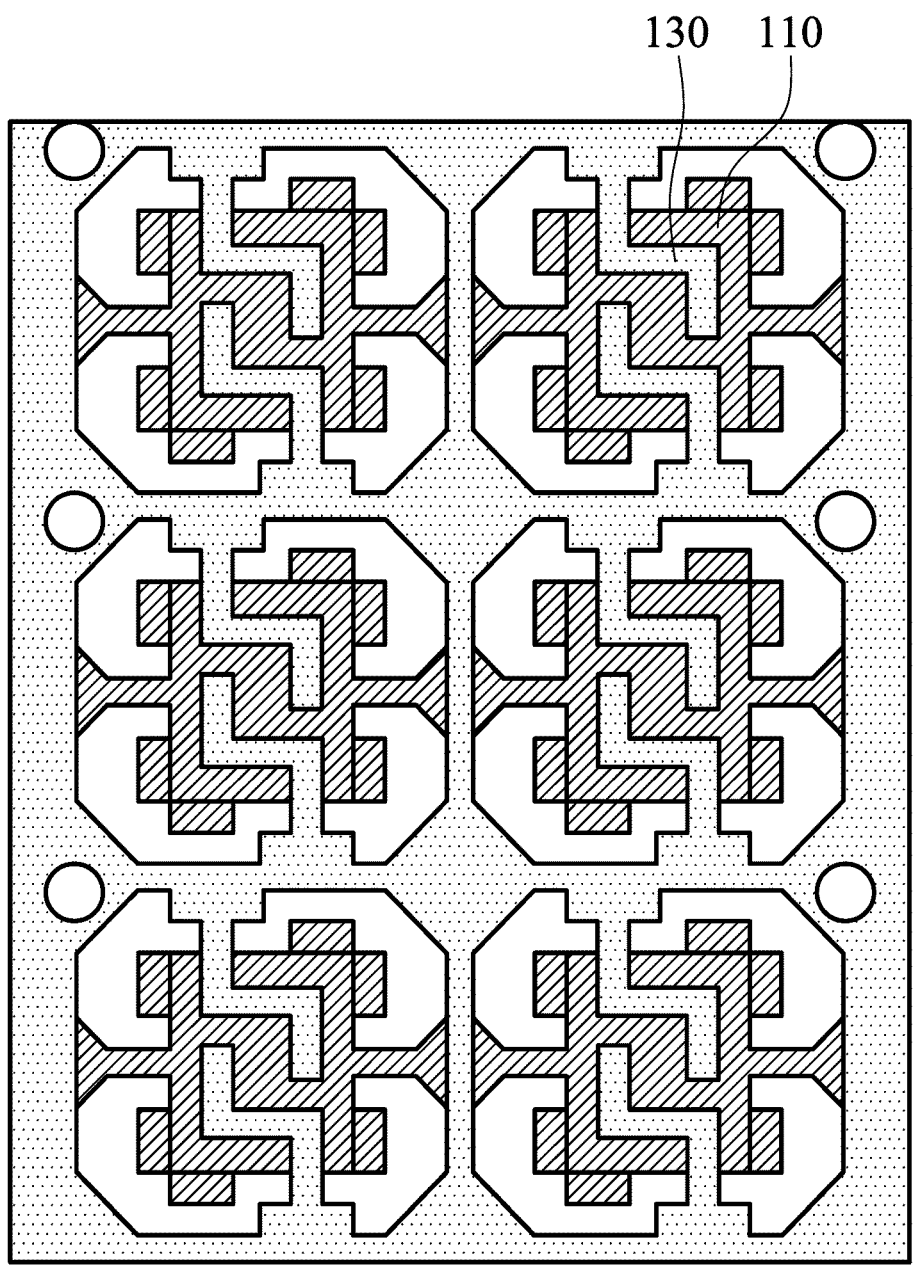
Figure 3D:
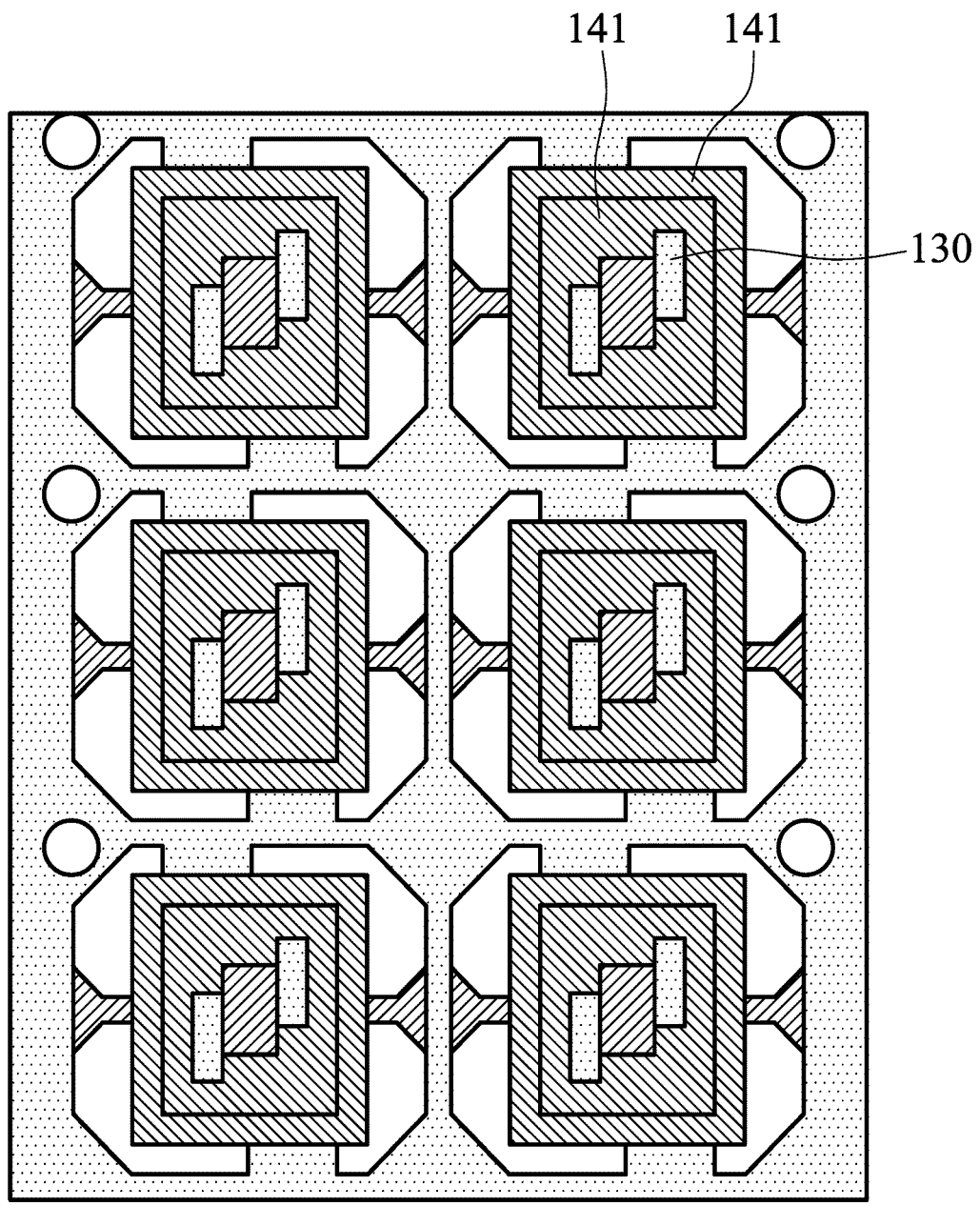
Figure 3E:
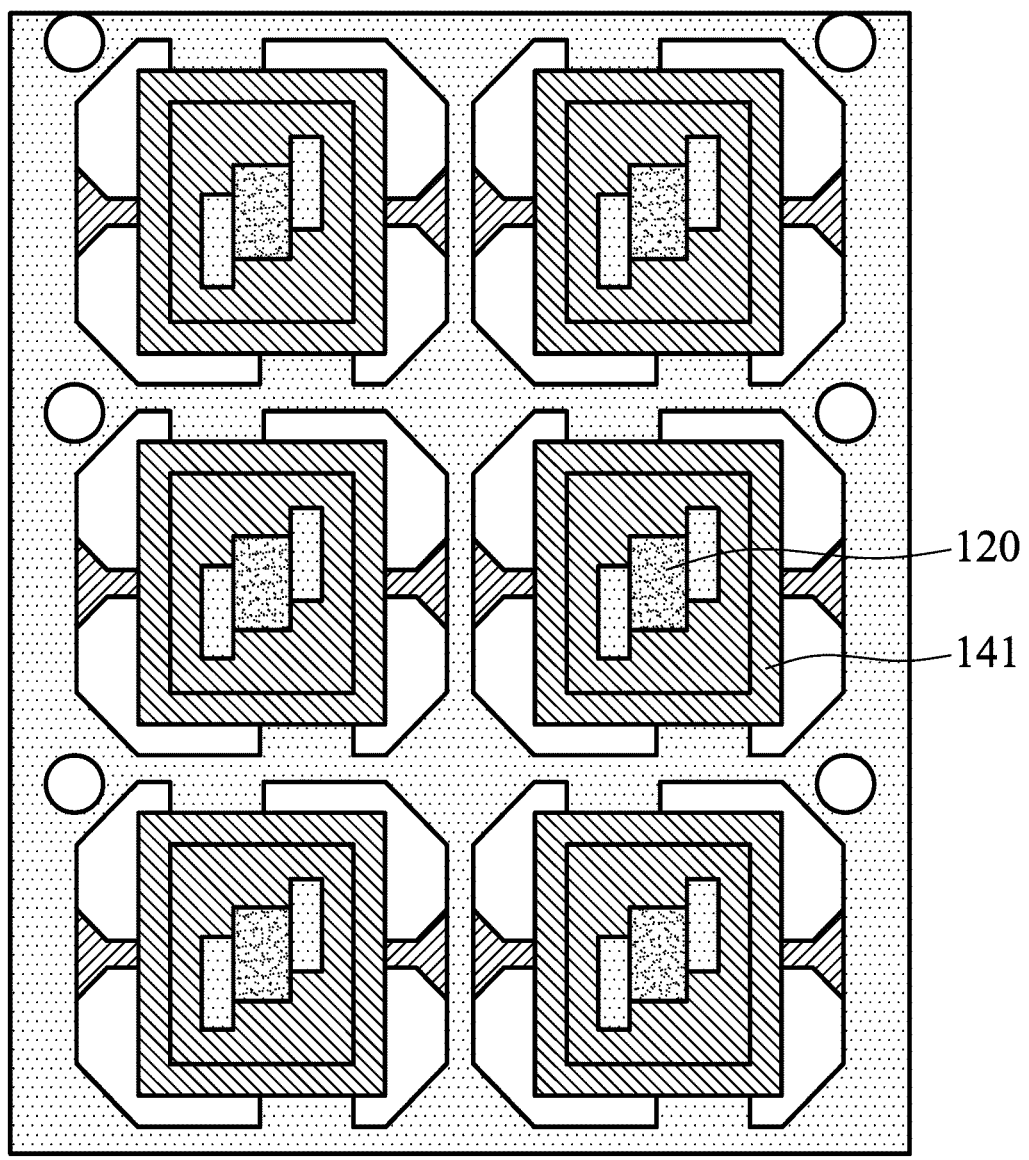
Figure 3F:
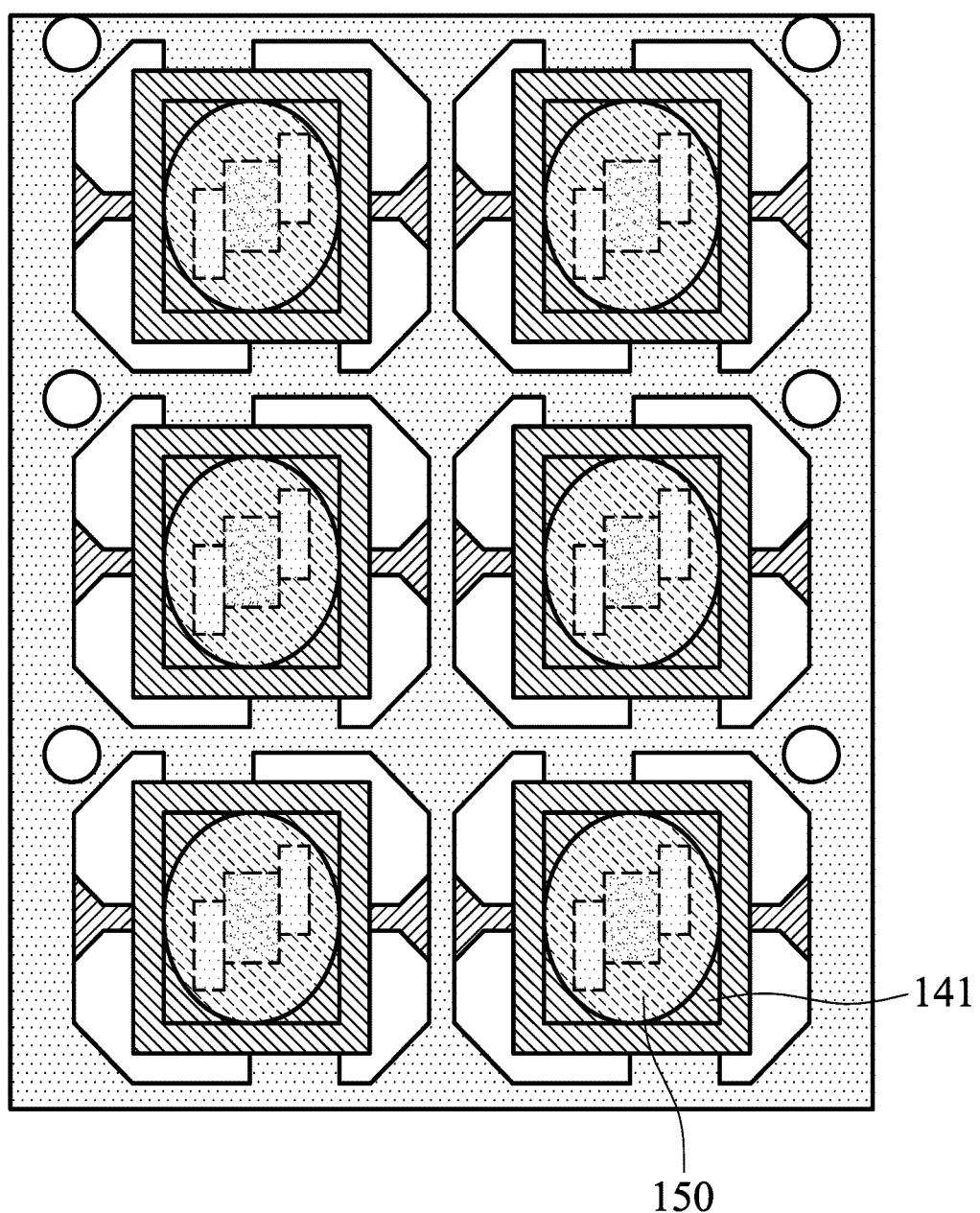

FIGS. 3A-3F show the steps of another method for assembling the LED package of the embodiment. With reference to FIG. 3A, first, the carriers 110 are formed on a first substrate 101 by punching, wherein two positioning holes 113 are formed on each of the carriers 110. Next, with reference to FIG. 3B, the conductive structures 130 are formed on a second substrate 102. Then, with reference to FIG. 3C, the second substrate 102 overlaps the first substrate 101 to assemble the carriers 110 and the conductive structures 130, wherein a plurality of posts of a mold pass through the positioning holes 113 abutting the conductive structures 130 to separate the carriers 110 from the conductive structures 130. Next, with reference to FIG. 3D, the first encapsulant 141 is injected into the carriers 110, wherein the first encapsulant 141 fixes the carriers 110 with the conductive structures 130, the first encapsulant 141 is entirely received in the carriers 110, and the carriers 110 are separated from the conductive structures 130 by the first encapsulant 141. Then, with reference to FIG. 3E, the LED chips 120 are disposed on the carrier 110, wherein the LED chips 120 are electrically connected to the conductive structures 130. Then, with reference to FIG. 3F, the second encapsulant 142 is injected to connect the lenses 150 to the first encapsulant 141. Finally, the LED packages are cut from the first and second substrates.

Figure 4A:
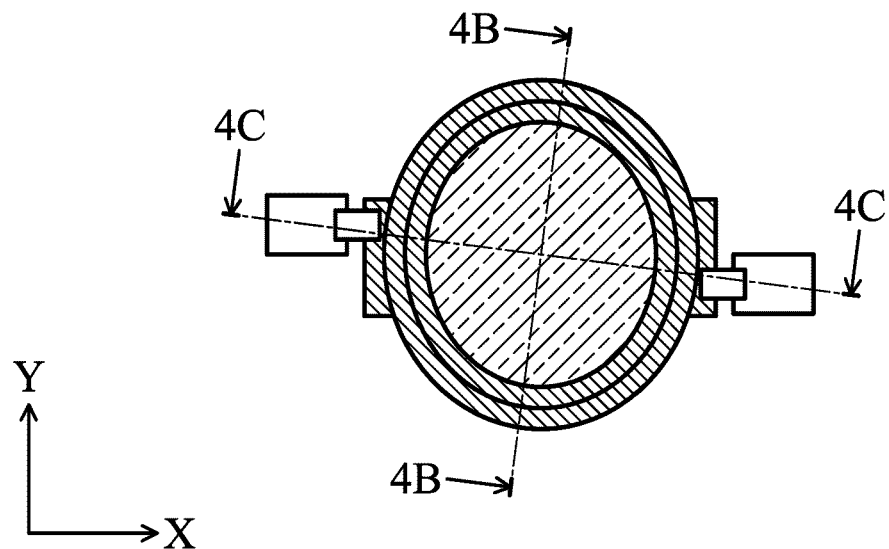
FIG. 4A is a top view of the LED package of the first embodiment.
Figure 4B:
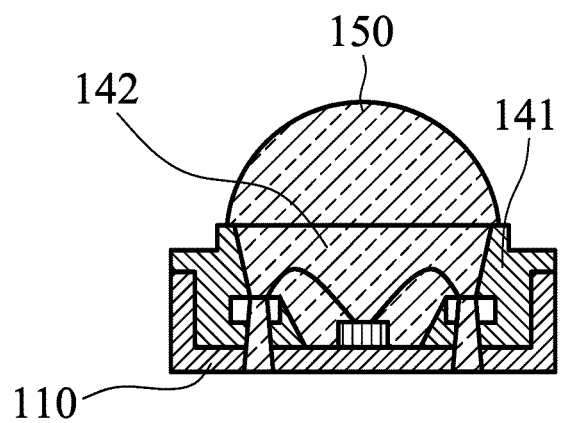
FIG. 4B is a sectional view along direction 4B-4B of FIG. 4A.
Figure 4C:
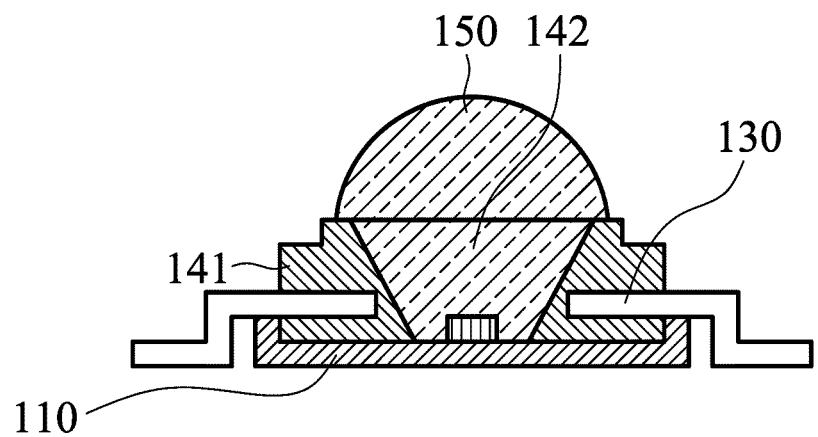
FIG. 4C is a sectional view along direction 4C-4C of FIG. 4A.
Figure 4D:
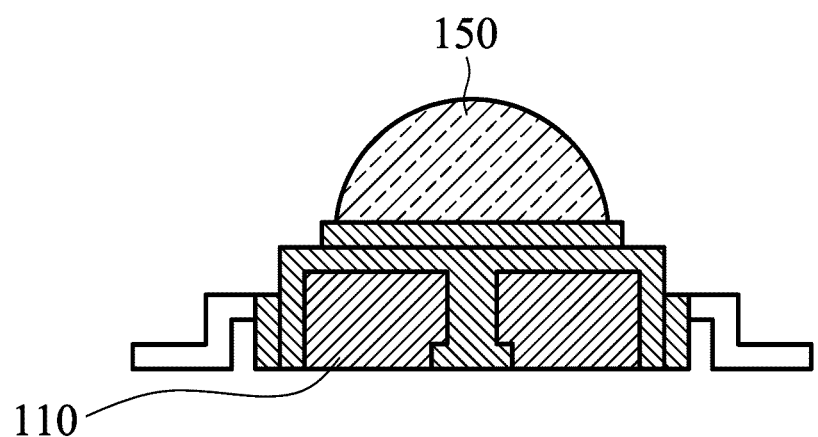
FIG. 4D is a side view along direction Y of FIG. 4A.
Figure 4E:
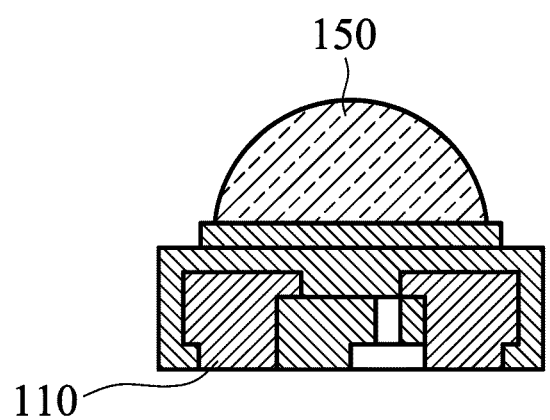
FIG. 4E is a side view along direction X of FIG. 4A.

FIG. 4A is a top view of the LED package of the first embodiment. FIG. 4B is a sectional view along direction 4B-4B of FIG. 4A. FIG. 4C is a sectional view along direction 4C-4C of FIG. 4A. FIG. 4D is a side view along direction Y of FIG. 4A. FIG. 4E is a side view along direction X of FIG. 4A.

The carrier 110 has a first cross section on a first plane (X-Y plane) and a second cross section on a second plane, the first plane is perpendicular to the second plane, the carrier 110 of the first cross section is circular, and the carrier 110 of the second cross section is U-shaped. Additionally, the first cross section on the first plane (X-Y plane) can be rectangular or polygonal.

Figure 5A:
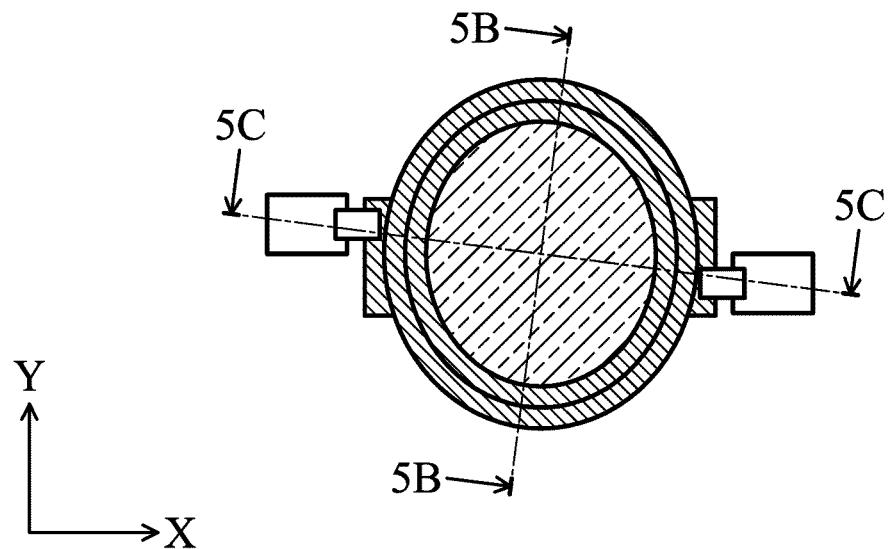
FIG. 5A is a top view of the LED package of the second embodiment.
Figure 5B:
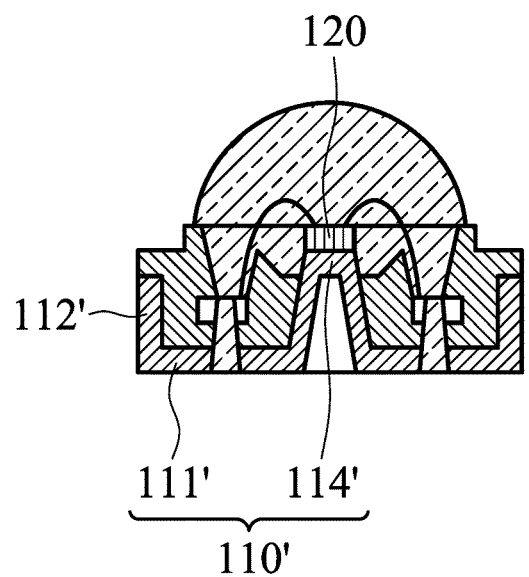
FIG. 5B is a sectional view along direction 5B-5B of FIG. 5A.
Figure 5C:
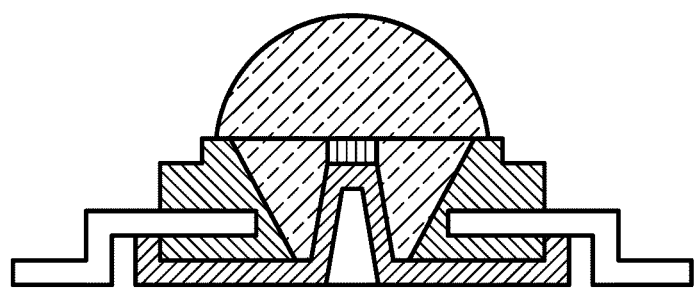
FIG. 5C is a sectional view along direction 5C-5C of FIG. 5A.

FIGS. 5A-5C shows an LED package of a second embodiment. FIG. 5A is a top view of the LED package of the second embodiment. FIG. 5B is a sectional view along direction 5B-5B of FIG. 5A. FIG. 5C is a sectional view along direction 5C-5C of FIG. 5A. The second embodiment is characterized by a protrusion 114' that is formed on the center of the bottom portion 111', and the LED chip 120 is disposed on the protrusion 114'. The protrusion 114' is formed by punching. The carrier 110' has a first cross section on a first plane (X-Y plane) and a second cross section on a second plane, the first plane is perpendicular to the second plane, the carrier 110' of the first cross section is circular, and the carrier 110' of the second cross section is W-shaped. Additionally, the first cross section on the first plane (X-Y plane) can be rectangular or polygonal. The carrier 110' has a bottom portion 111' and a lateral wall 112'. Heat generated by the LED chip 120 is transmitted to the heat sink via the bottom portion 111' and the lateral wall 112' of the carrier 110'.

Figure 6A:
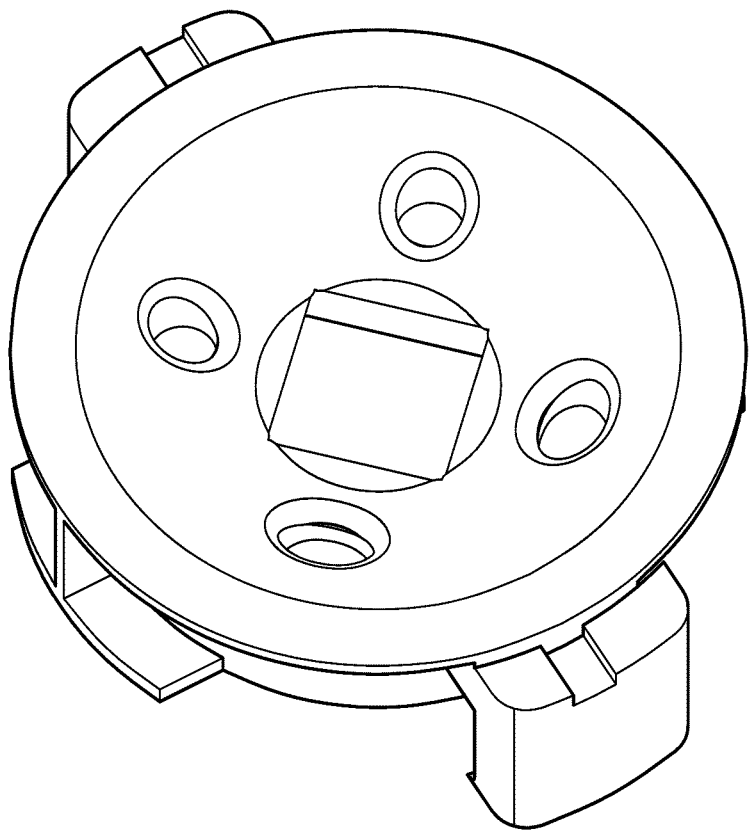
FIG. 6A is a perspective view of the carrier of the second embodiment.
Figure 6B:
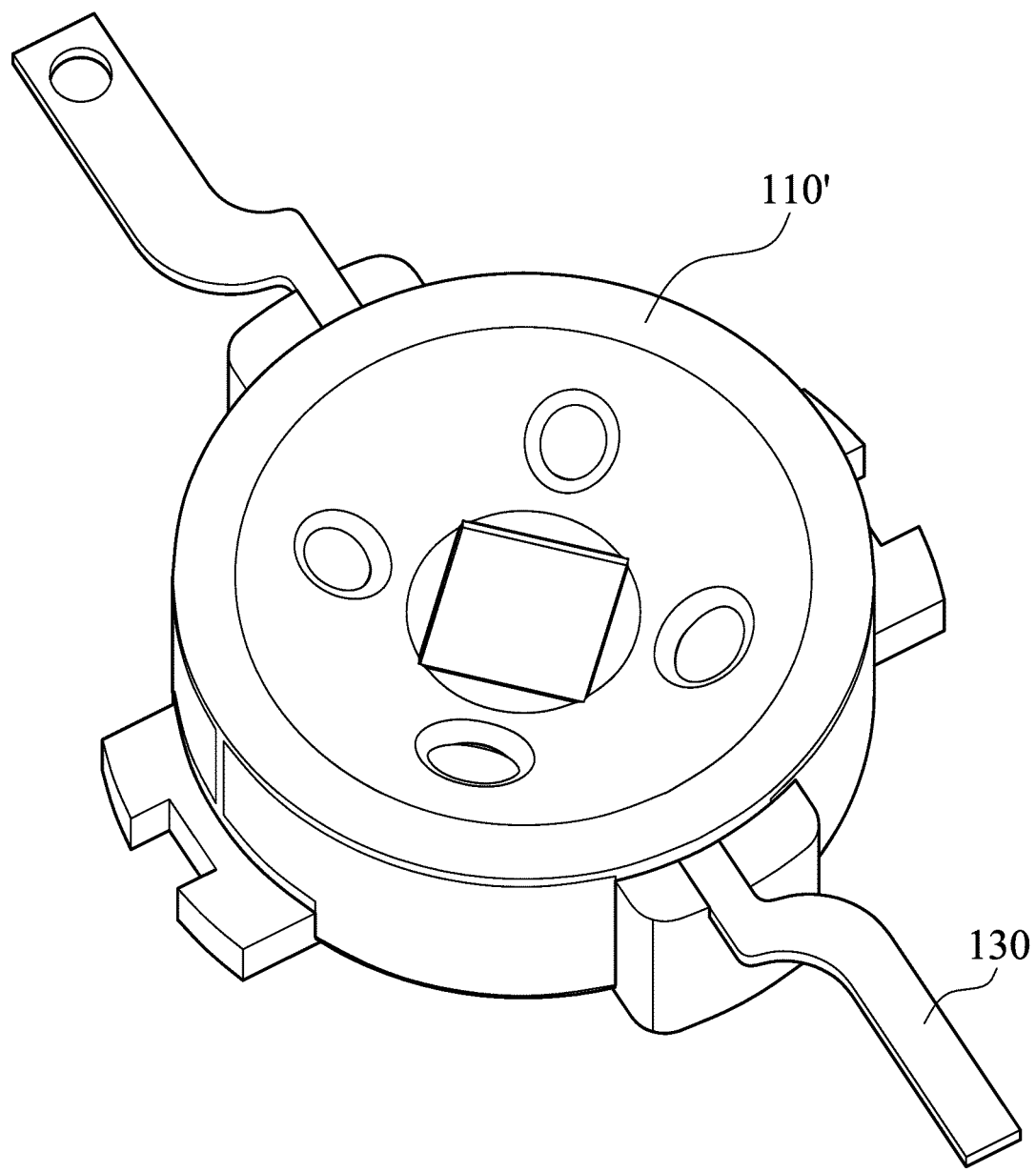
FIG. 6B shows the carrier assembled with the conductive structure and the first encapsulant.
Figure 6C:
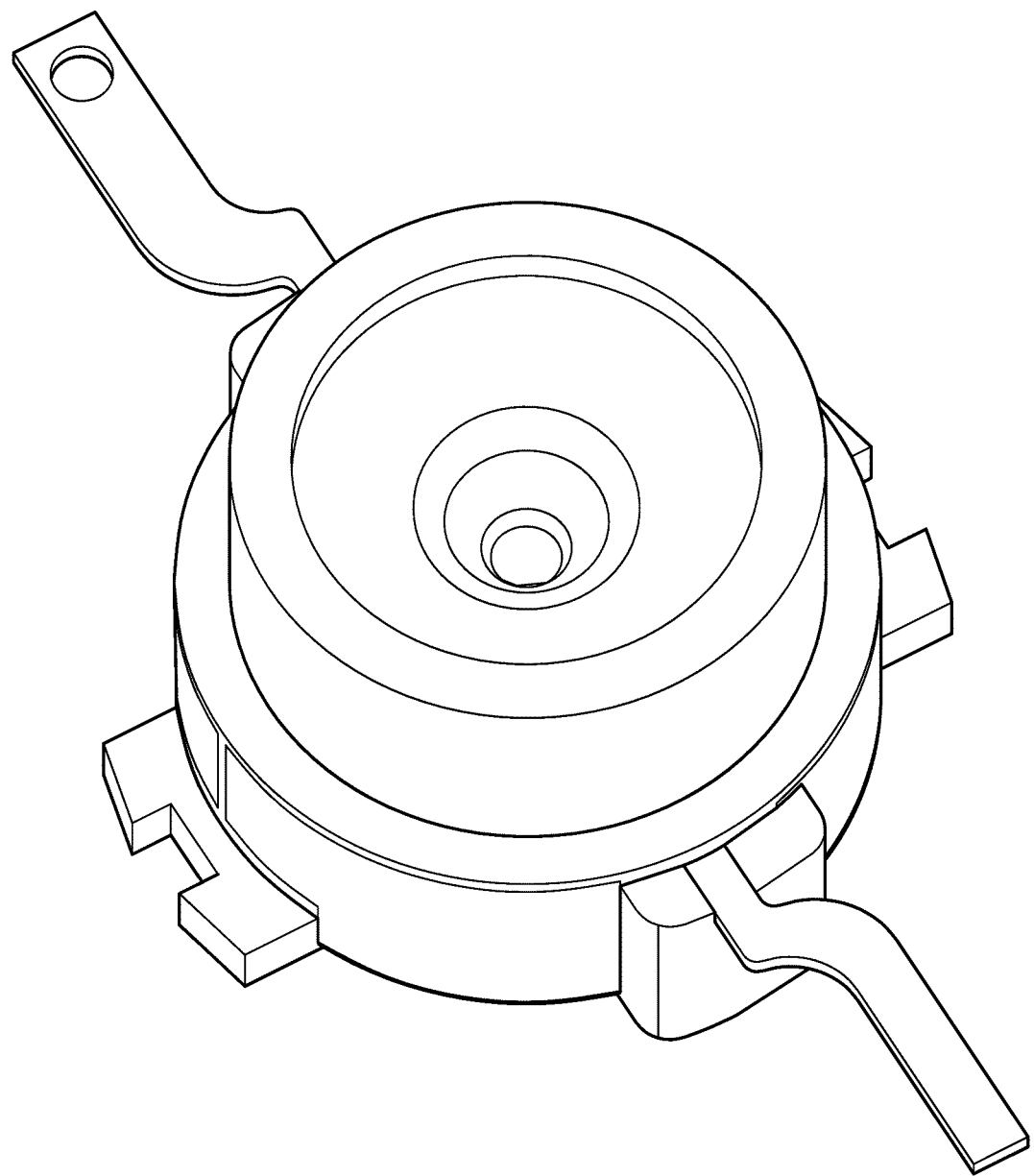
FIG. 6C is a perspective view of the LED package of the second embodiment.

FIG. 6A is a perspective view of the carrier 110' of the second embodiment. FIG. 6B shows the carrier 110' assembled with the conductive structure 130 and the first encapsulant 141. FIG. 6C is a perspective view of the LED package of the second embodiment.

Figure 7A:
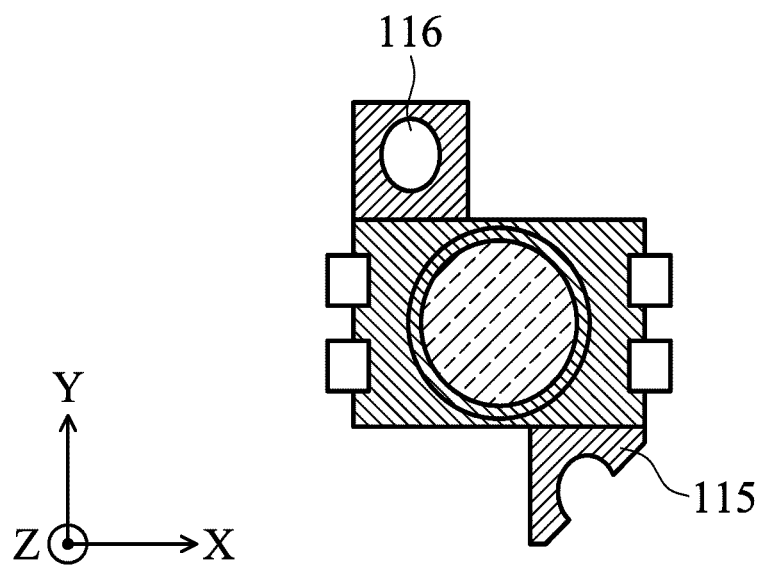
FIGS. 7A, 7B and 7C show modified embodiments.

FIG. 7A shows a modified embodiment, wherein the carrier further comprises an extending portion 115, the extending portion 115 has openings 116 allowing screw nails to pass through.

Figure 7B:
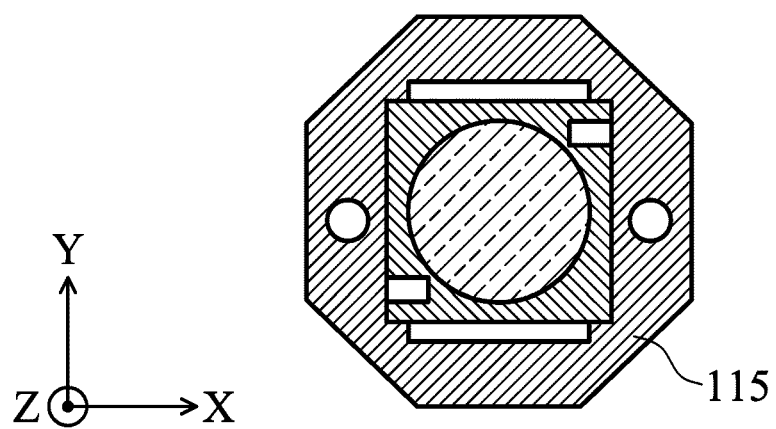
Figure 7C:
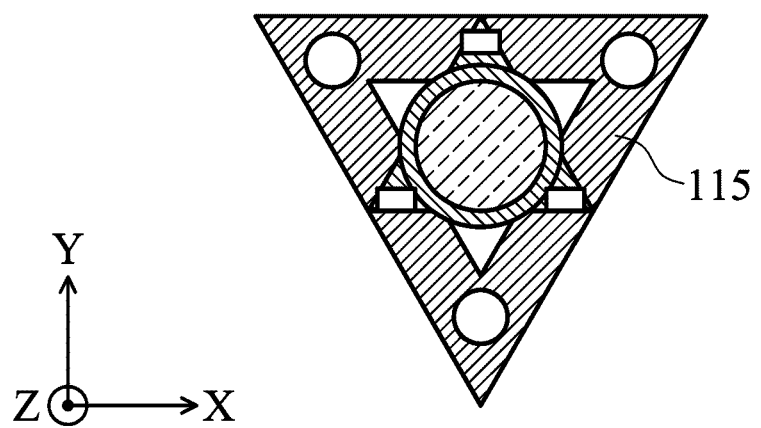
Figure 7D:
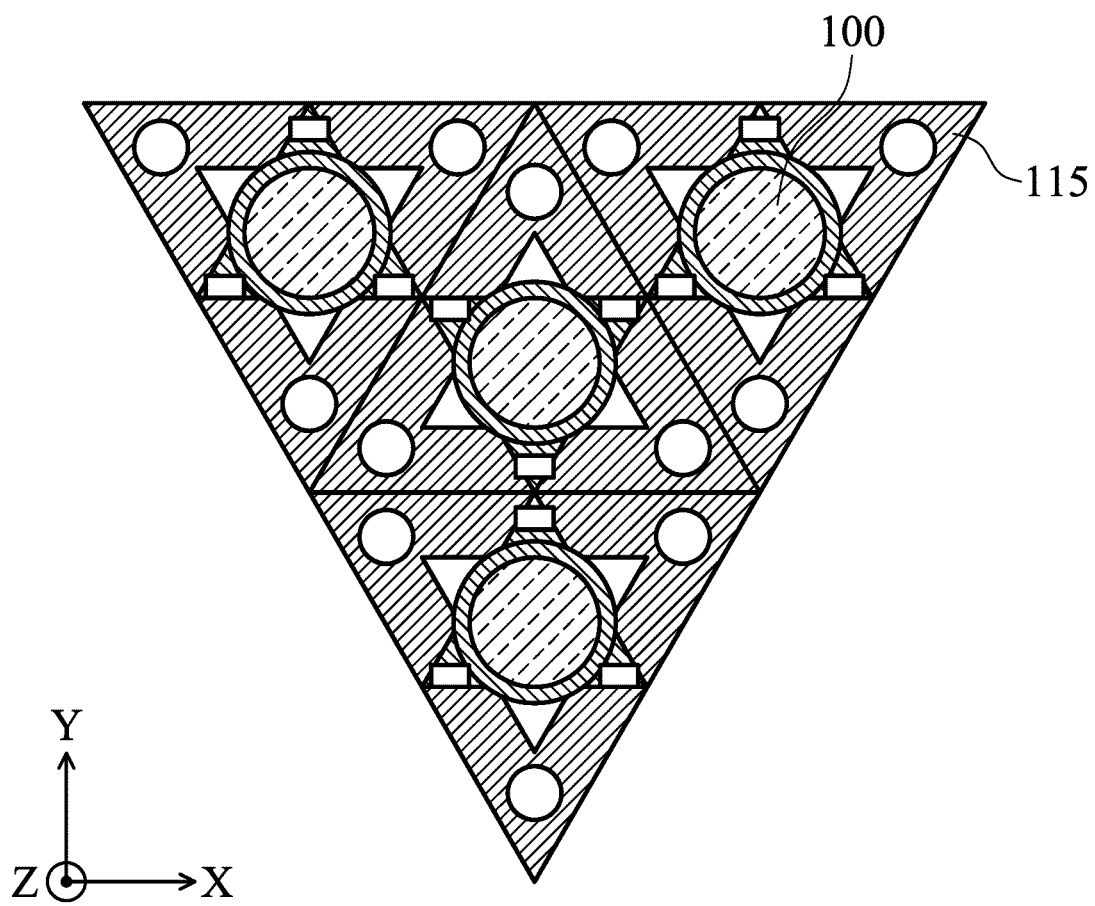
FIG. 7D shows an LED module of an embodiment.

With reference to FIGS. 7B and 7C, the extending portion 115 is polygonal or triangular. With reference to FIGS. 7B and 7C, the extending portion 115 can be polygonal or triangular. With reference the FIG. 7D, the LED packages 100 can be assembled as an LED module 200.

In the embodiments, a reflective material can be coated on the carrier and the conductive structure. Additionally, an electrically conductive material can be coated on the carrier and the conductive structure.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. An LED package, comprising:
a carrier integrally punched from a metal sheet into a cup shape comprising a bottom portion and a lateral wall;
an LED chip, received in the carrier and disposed on the bottom portion;
a conductive structure, electrically connected to the LED chip;
a first encapsulant, received in the carrier and fixing the carrier and the conductive structure, wherein the first encapsulant separates the carrier from the conductive structure;
a lens, corresponding to the LED chip, wherein the LED chip, the conductive structure, the lens, and the first encapsulant are assembled on the carrier to form an assembly, wherein the lens is entirely within the lateral wall of the carrier from a top view; and a heat sink having a recess corresponding in shape to the carrier, wherein the assembly is received in the recess such that the carrier is embedded in the heat sink, and heat generated by the LED chip is transmitted to the heat sink via the bottom portion and the lateral wall of the carrier, wherein the heat sink is not integrally formed with the carrier.

2. The LED package as claimed in claim 1, wherein the conductive structure comprises at least one lead.

3. The LED package as claimed in claim 2, wherein the lead has a free end, and the free end is suspended in midair.

4. The LED package as claimed in claim 2, wherein the lead has a free end, and the free end is attached on a lateral surface of the first encapsulant.

5. The LED package as claimed in claim 1, further comprising a second encapsulant, connecting the lens to the first encapsulant.

6. The LED package as claimed in claim 1, wherein a reflective material is coated on the carrier and the conductive structure.

7. The LED package as claimed in claim 1, wherein an electrically conductive material is coated on the carrier and the conductive structure.

8. The LED package as claimed in claim 1, wherein a positioning hole is formed on the carrier.

9. The LED package as claimed in claim 1, wherein the carrier has a first cross section on a first plane and a second cross section on a second plane, the first plane is perpendicular to the second plane, the first cross section is circular, and the second cross section is U-shaped.

10. The LED package as claimed in claim 1, wherein a protrusion is formed on the center of the bottom portion, and the LED chip is disposed on the protrusion.

11. An LED package, comprising:
a carrier integrally formed by punching from a metal sheet, wherein the carrier is cup shaped and comprises a bottom portion and a lateral wall;
a conductive structure formed by punching;
a first encapsulant injected into the carrier, wherein the first encapsulant fixes the carrier and the conductive structure, wherein the first encapsulant separates the carrier from the conductive structure;
a LED chip disposed on the carrier and electrically connected to the LED chip and the conductive structure;
a lens packaged with the LED chip, wherein the lens corresponds to the LED chip; and
wherein carrier, the conductive structure, the first encapsulant, the LED chip and the lens are first assembled together, and then the carrier is embedded in a heat sink such that heat generated by the LED chip is transmitted to the heat sink via the bottom portion and the lateral wall of the carrier.

12. The LED package as claimed in claim 11, wherein the carrier is made of metal.

13. The LED package as claimed in claim 11, wherein the conductive structure comprises at least one lead.

14. The LED package as claimed in claim 13, wherein the lead has a free end, and the free end is suspended in midair.

15. The LED package as claimed in claim 13, wherein the lead has a free end, and the free end is attached on a lateral surface of the first encapsulant.

16. The LED package as claimed in claim 11, further comprising a second encapsulant, connecting the lens to the first encapsulant.

17. The LED package as claimed in claim 11, wherein a reflective material is coated on the carrier and the conductive structure.

18. The LED package as claimed in claim 11, wherein an electrically conductive material is coated on the carrier and the conductive structure.

19. The LED package as claimed in claim 11, wherein a positioning hole is formed on the carrier.

20. The LED package as claimed in claim 11, wherein the carrier has a first cross section on a first plane and a second cross section on a second plane, the first plane is perpendicular to the second plane, the first cross section is circular, and the second cross section is U-shaped.

21. The LED package as claimed in claim 11, wherein a protrusion is formed on the center of the bottom portion, and the LED chip is disposed on the protrusion.

* * * * *